US009407255B2

(12) United States Patent
Kuenemund

(10) Patent No.: US 9,407,255 B2
(45) Date of Patent: Aug. 2, 2016

(54) CIRCUIT

(71) Applicant: Infineon Technologies AG, Neubiberg (DE)

(72) Inventor: Thomas Kuenemund, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/947,156

(22) Filed: Jul. 22, 2013

(65) Prior Publication Data

US 2014/0035624 A1 Feb. 6, 2014

(30) Foreign Application Priority Data

Aug. 1, 2012 (DE) .......................... 10 2012 107 024

(51) Int. Cl.
| | |
|---|---|
| *H03B 1/00* | (2006.01) |
| *H03K 3/00* | (2006.01) |
| *H03K 17/30* | (2006.01) |
| *G11C 7/20* | (2006.01) |
| *G11C 29/02* | (2006.01) |

(52) U.S. Cl.
CPC ........ *H03K 17/30* (2013.01); *G11C 7/20* (2013.01); *G11C 29/021* (2013.01); *G11C 29/028* (2013.01); *G11C 2207/2227* (2013.01)

(58) Field of Classification Search
CPC .............. H03K 19/00315; H03K 19/00361; H03K 19/0013; H03K 19/018521; H03K 17/164

USPC ............ 327/170, 112, 108, 205–206; 326/83, 326/85
See application file for complete search history.

(56) References Cited

U.S. PATENT DOCUMENTS

| | | | | |
|---|---|---|---|---|
| 6,124,747 | A * | 9/2000 | Nasu ............................. | 327/281 |
| 6,380,770 | B1 * | 4/2002 | Pasqualini .................... | 327/112 |
| 6,388,487 | B1 * | 5/2002 | Hirose .......................... | 327/205 |
| 7,511,547 | B2 | 3/2009 | Suda et al. | |
| 7,782,091 | B2 * | 8/2010 | Lee ................................ | 326/87 |
| 2005/0068076 | A1 | 3/2005 | Iroaga | |
| 2006/0267656 | A1 | 11/2006 | Suda et al. | |

FOREIGN PATENT DOCUMENTS

| | | |
|---|---|---|
| CN | 1894852 A | 1/2007 |
| EP | 1187331 A1 | 3/2002 |

OTHER PUBLICATIONS

English language abstract of EP 1 187 331 A1 dated Mar. 13, 2002.

* cited by examiner

*Primary Examiner* — Quan Tra
(74) *Attorney, Agent, or Firm* — Viering, Jentschura & Partner mbB

(57) ABSTRACT

In accordance with various embodiments, a circuit is provided, including an output node, a first potential varying stage, which is designed to couple the output node to a supply potential in reaction to an input signal, and a second potential varying stage, which is designed to couple the output node to the supply potential if the difference between the potential of the output node and the supply potential lies below a predefined threshold value.

16 Claims, 5 Drawing Sheets

US 9,407,255 B2

CIRCUIT

CROSS-REFERENCE TO RELATED APPLICATION

This application claims priority to German Patent Application Serial No. 10 2012 107 024.5, which was filed Aug. 1, 2012, and is incorporated herein by reference in its entirety.

TECHNICAL FIELD

Embodiments relate generally to circuits.

BACKGROUND

In electronic devices, such as smart cards, for example, it may be necessary, for example upon transition to or from an energy-saving mode, for a (circuit) node to be subjected to charge reversal as rapidly as possible, but without a permissible maximum charging/discharging current being exceeded in the process. Accordingly, circuits are desirable which enable a node to be discharged or charged as rapidly as possible, or in other words charge reversal from one potential to another potential, without exceeding a maximum permissible current in the process.

SUMMARY

In accordance with one embodiment, a circuit is provided, including an output node, a first potential varying stage, which is designed to couple the output node to a supply potential in reaction to an input signal, and a second potential varying stage, which is designed to couple the output node to the supply potential if the difference between the potential of the output node and the supply potential lies below a predefined threshold value.

BRIEF DESCRIPTION OF THE FIGURES

The figures do not reproduce the actual size relationships, but rather are intended to serve to illustrate the principles of the different embodiments. Various embodiments are described below with reference to the following figures.

DESCRIPTION

The following detailed description refers to the accompanying figures, which show details and embodiments. These embodiments are described in sufficient detail to enable the person skilled in the art to implement the invention. Other embodiments are also possible and the embodiments can be modified in a structural, logical and electrical regard, without departing from the subject matter of the invention. The different embodiments are not necessarily mutually exclusive, rather different embodiments can be combined with one another, thus giving rise to new embodiments.

In accordance with one embodiment, a circuit for rapid charging and/or discharging, for example of nodes having a high capacitive load, is provided, including an adjustable current limiting arrangement and a (charge) state indicator, i.e. having an output signal that indicates the charge state of the node to be charged (which can be regarded as the output node of the circuit).

Such a circuit may be used for example for an energy-saving mode (standby) circuit for the data path of an arithmetic unit in order to meet the requirements for high computational speed and low (static) energy-saving mode current consumption.

Such a circuit may generally be used, upon transition between energy-saving mode and normal operating mode of an integrated circuit, to subject a node to charge reversal rapidly but with controllable (e.g. restricted) charging/discharging current, for example to subject the output node of a circuit, said output node being decoupled from VSS in the energy-saving mode, to charge reversal from VSS to VDD. The restriction of the charging/discharging current may be of importance in smart cards, for example, in which an excessively high current can lead to errors (for example to a field modulation which is misunderstood by a reader as useful information transmission).

A further possible application consists, for example, in the circuit-technologically supervised charging and discharging of the supply voltage of memory cell arrays in order to generate PUFs (Physically Unclonable Functions).

Figure 1:
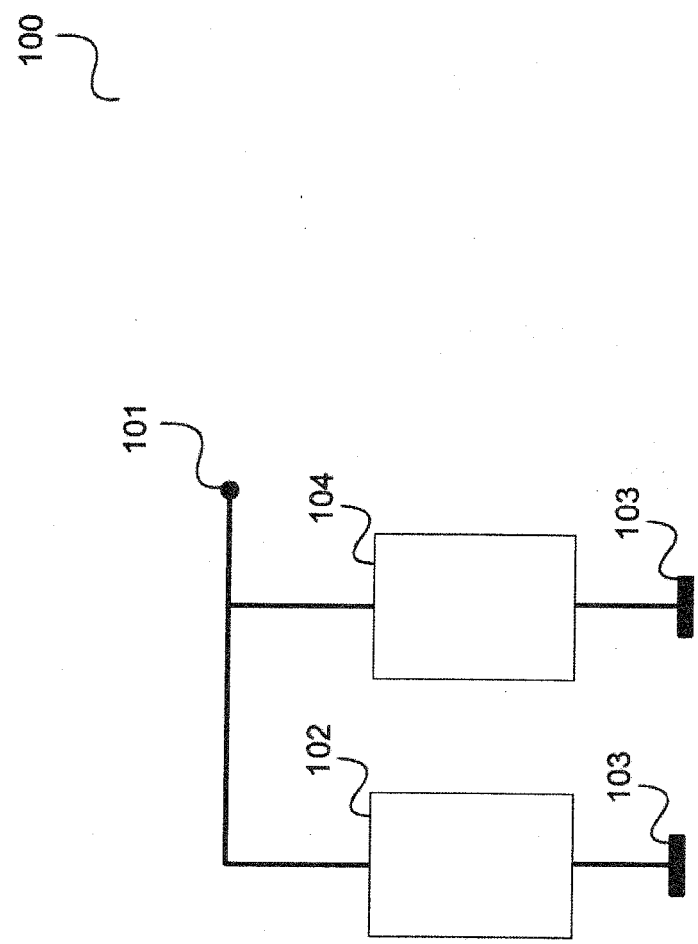
FIG. 1 shows a circuit in accordance with one embodiment.

FIG. 1 shows a circuit 100 in accordance with one embodiment.

The circuit 100 includes an output node 101 and a first potential varying stage 102, which is designed to couple the output node 101 to a supply potential 103 (e.g. VDD or VSS) in reaction to an input signal.

The circuit 100 furthermore includes a second potential varying stage 104, which is designed to couple the output node 101 to the supply potential 103 if the difference between the supply potential 103 of the output node 101 and the supply potential 103 lies below a predefined threshold value.

In other words, in accordance with one embodiment, there are a plurality of potential varying stages (e.g. pull-up stages or pull-down stages) which are switched on (in other words activated), depending on the state of the output node, i.e. vary the potential of the output node (further), by coupling, when they are active, the output node to the supply potential in the direction of which the potential of the output node is intended to be varied.

Coupled can be understood as electrically conductively connected or electrically coupled.

The circuit may be arranged for example in a smart card IC (IC: Integrated Circuit). Accordingly, by way of example, a smart card having a smart card IC including the circuit described above may be provided.

In accordance with one embodiment, the supply potential is a low supply potential (e.g. VSS) and the potential varying stages are pull-down stages. In accordance with another embodiment, the supply potential is a high supply potential (e.g. VDD) and the potential varying stages are pull-up stages. It is also possible to provide two (or more) pull-down stages corresponding to the first potential varying stage and the second potential varying stage and two (or more) pull-up stages corresponding to the first potential varying stage and the second potential varying stage in a circuit, such that potential varying stages for varying the potential of the output node in the direction of a low supply potential (by means of the pull-down stages) and also potential varying stages for varying the potential of the output node in the direction of a high supply potential (by means of the pull-up stages) are provided.

The circuit may have an input node, wherein the input signal is the presence of a predefined level at the input node. By way of example, the input signal consists in a high level (e.g. a logic 1 or an H level) being applied to the input node, or a low level (e.g. a logic zero or an L level) being applied to the input node.

The first potential varying stage is designed, for example, to couple the output node to the supply potential as long as the predefined level is present at the input node.

The second potential varying stage is designed, for example, to couple the output node to the supply potential if the difference between the potential of the output node and the supply potential lies below a predefined threshold value and if the predefined level is present at the input node.

The circuit includes a further potential varying stage, for example, which is designed to couple the output node to a further supply potential if a further predefined level, which differs from the predefined level, is present at the input node. As explained above, it is also possible to provide a plurality of such further potential varying stages which are configured analogously to the first potential varying stage and to the second potential varying stage and are designed for varying the potential of the output node in the direction of the further supply potential (e.g. VDD if the supply potential is VSS, or VSS if the supply potential is VDD).

In accordance with one embodiment, the circuit includes a third potential varying stage, which is designed to couple the output node to the supply potential if the difference between the potential of the output node and the supply potential lies below a further predefined threshold value. Illustratively, it is possible to provide one or a plurality of further potential varying stages analogously to the second potential varying stage.

The further threshold value and the threshold value are different, for example. The third potential varying stage can therefore be switched on for example at a different point in time than the second potential varying stage, for example if the potential of the output node is already closer to the supply potential.

The threshold value (and/or the further threshold value if a third potential varying stage is present) lies between the supply potential and a further supply potential, for example.

In accordance with one embodiment, the circuit furthermore includes a state signal output and a state signal generating circuit, which is designed to generate a state signal and to output it by means of the state signal output, said signal indicating whether the difference between the potential of the output node and the supply potential lies below a predefined threshold value, or indicating whether the difference between the potential of the output node and the supply potential lies below a further predefined threshold value. Illustratively, the circuit is designed to generate a state signal that indicates the discharging/charging progress of the output node and makes it possible, for example, to estimate when the output node has reached a desired target potential.

In accordance with one embodiment, the second potential varying stage has a detection circuit, which detects whether the difference between the potential of the output node and the supply potential lies below the predefined threshold value. By way of example, by means of a field effect transistor it is possible to detect whether the difference between the potential of the output node and the supply potential lies below the predefined threshold value, by means of the field effect transistor being arranged such that the gate-source voltage present at said transistor is greater (in terms of absolute value) than the threshold voltage of said transistor, if the difference between the potential of the output node and the supply potential lies below the predefined threshold value.

The second potential varying stage has for example a switch having a control input, wherein the control input is coupled to the output node and the switch is designed to be switched on depending on whether the difference between the potential of the output node and the supply potential lies below the predefined threshold value.

The switch is for example a field effect transistor, the gate terminal of which is coupled to the output node.

The second potential varying stage (or a third potential varying stage as mentioned above) may have a delay circuit, which delays the coupling of the output node to the supply potential by the second potential varying stage relative to the coupling of the output node to the supply potential by the first potential varying stage (or else the second potential varying stage if the delay circuit is provided in a third potential varying stage).

Illustratively, it may be ensured that the second potential varying stage only couples the output node to the supply potential if the difference between the potential of the output node and the supply potential lies below the predefined threshold value, by virtue of the fact that there is a wait for a specific time to elapse after the first potential varying stage has coupled the output node to the supply potential. The delay circuit may be implemented, for example, by the fact that firstly a node has to be subjected to charge reversal before a switch in the second potential varying stage activates.

One embodiment is described in greater detail below with reference to FIG. 2.

Figure 2:
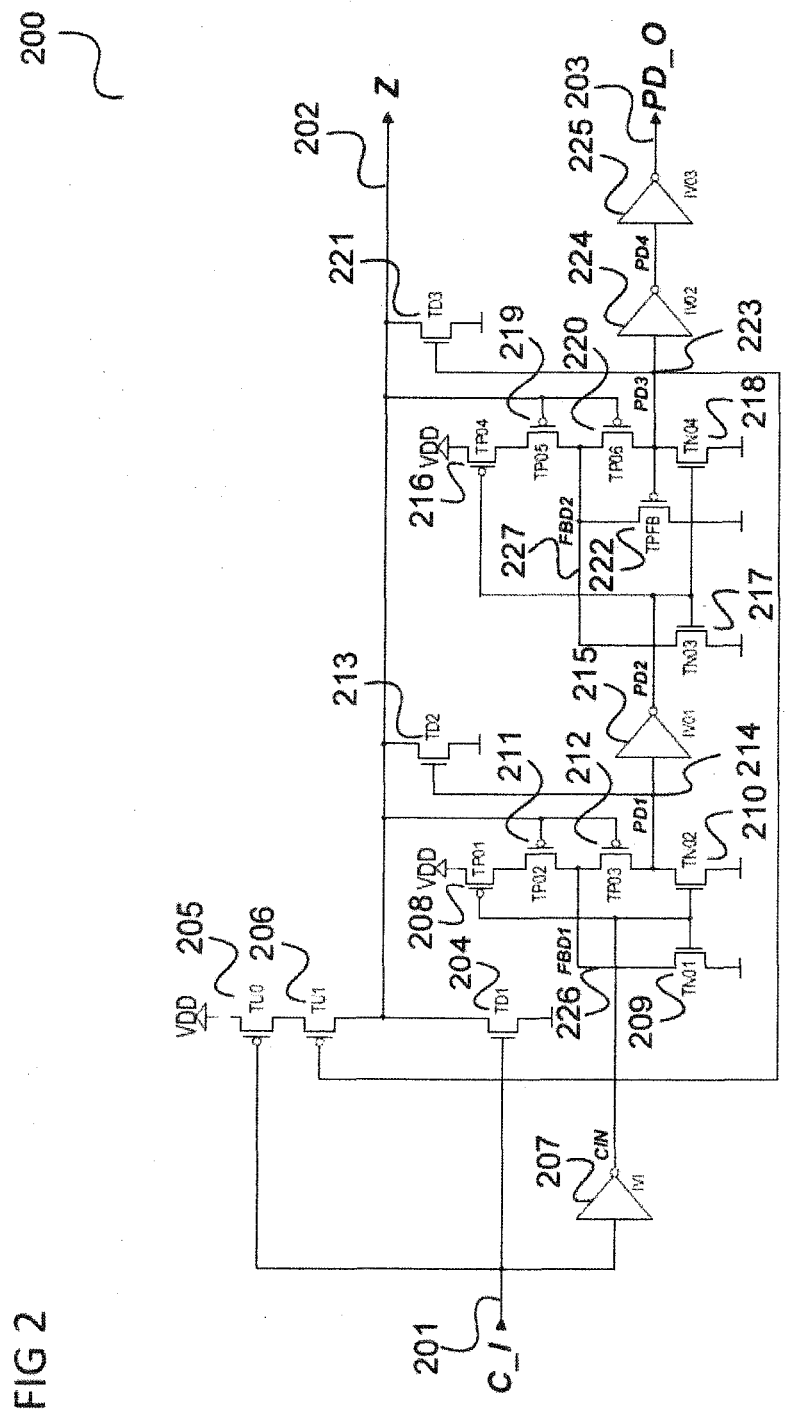
FIG. 2 shows a circuit in accordance with one embodiment.

FIG. 2 shows a circuit 200 in accordance with one embodiment.

The circuit 200 has an input node 201 for an input signal C_I, an output node 202 (designated as Z) and a state signal output node 203 for an output signal PD_O.

The input node 201 is coupled to the gate terminal of a first nMOS (Metal Oxide Semiconductor) transistor 204, the source terminal of which is coupled to VSS and the drain terminal of which is coupled to the output node 202. The first nMOS transistor 204 can be regarded as a first pull-down stage (generally potential varying stage) of the circuit 200.

It should be noted that nMOS transistors and pMOS transistors are used in the circuit 200, but alternatively other types of n- and/or p-channel field effect transistors can also be used, for example JFETs (junction field effect transistors), MESFETs (metal semiconductor field effect transistors) etc.

The input node 201 is furthermore coupled to the gate terminal of a first pMOS transistor 205, the source terminal of which is coupled to VDD and the drain terminal of which is coupled to the source terminal of a second pMOS transistor 206. The drain terminal of the second pMOS transistor 206 is coupled to the output node 202.

The input node 201 is furthermore coupled to the input of a first inverter 207.

The output of the first inverter is coupled to the gate of a third pMOS transistor 208, of a second nMOS transistor 209 and of a third nMOS transistor 210. The source terminal of the third pMOS transistor 208 is coupled to VDD and the source terminals of the second nMOS transistor 209 and of the third nMOS transistor 210 are coupled to VSS. The drain terminal of the third pMOS transistor 208 is coupled to the source terminal of a fourth pMOS transistor 211, the drain terminal of which, for its part, is coupled to the source terminal of a fifth pMOS transistor 212. The drain terminal of the fifth pMOS transistor 212 and the drain terminal of the third nMOS transistor 210 are coupled to the gate terminal of a fourth nMOS transistor 213.

The drain terminal of the second nMOS transistor 209 is coupled to the source terminal of the fifth pMOS transistor 212. The gate terminals of the fourth pMOS transistor 211 and of the fifth pMOS transistor 212 are coupled to the output node 202.

The source terminal of the fourth nMOS transistor 213 is coupled to VSS and the drain terminal of the fourth nMOS transistor 213 is coupled to the output node 202.

That part of the circuit 200 which consists of the second nMOS transistor 209, the third nMOS transistor 210, the fourth nMOS transistor 213, the third pMOS transistor 208, the fourth pMOS transistor 211 and the fifth pMOS transistor 212 can be regarded as a second pull-down stage of the circuit 200.

A first node 214, which is coupled to the drain terminals of the third nMOS transistor 210 and of the fifth pMOS transistor 212 and the gate terminal of the fourth nMOS transistor 213, can be regarded as an output node of the second pull-down stage. The first node 214 is coupled to the input of a second inverter 215.

The output of the second inverter 215 is coupled to the gate terminal of a sixth pMOS transistor 216, of a fifth nMOS transistor 217 and of a sixth nMOS transistor 218. The source terminal of the sixth pMOS transistor 216 is coupled to VDD and the source terminals of the fifth nMOS transistor 217 and of the sixth nMOS transistor 218 are coupled to VSS. The drain terminal of the sixth pMOS transistor 216 is coupled to the source terminal of a seventh pMOS transistor 219, the drain terminal of which, for its part, is coupled to the source terminal of an eighth pMOS transistor 220. The drain terminal of the eighth pMOS transistor 220 and the drain terminal of the sixth nMOS transistor 218 are coupled to the gate terminal of a seventh nMOS transistor 221.

The drain terminal of the fifth nMOS transistor 217 is coupled to the source terminal of the eighth pMOS transistor 220. The drain terminal of the fifth nMOS transistor 217 is furthermore coupled to the source terminal of a ninth pMOS transistor 222, the drain terminal of which is coupled to VSS and the gate terminal of which is coupled to the drain terminal of the sixth nMOS transistor 218. The gate terminals of the seventh pMOS transistor 219 and of the eighth pMOS transistor 220 are coupled to the output node 202.

The source terminal of the seventh nMOS transistor 221 is coupled to VSS and the drain terminal of the seventh nMOS transistor 221 is coupled to the output node 202.

That part of the circuit 200 which consists of the fifth nMOS transistor 217, the sixth nMOS transistor 218, the seventh nMOS transistor 221, the sixth pMOS transistor 216, the seventh pMOS transistor 219, the eighth pMOS transistor 220 and the ninth pMOS transistor 222 can be regarded as a third pull-down stage of the circuit 200. A second node 223, which is coupled to the drain terminals of the sixth nMOS transistor 218 and of the eighth pMOS transistor 220 and the gate terminals of the seventh nMOS transistor 221 and of the ninth pMOS transistor 222, can be regarded as an output node of the second pull-down stage. The second node 223 is coupled to the input of a third inverter 224.

The output of the third inverter 224 is coupled to the input of a fourth inverter 225, the output of which is coupled to the state signal output node 203.

The pull-down stages can be regarded as active if the first nMOS transistor 204, the fourth nMOS transistor 213 and the seventh nMOS transistor 221 switch on.

The function of the circuit 200 is explained below with reference to FIG. 3.

Figure 3:
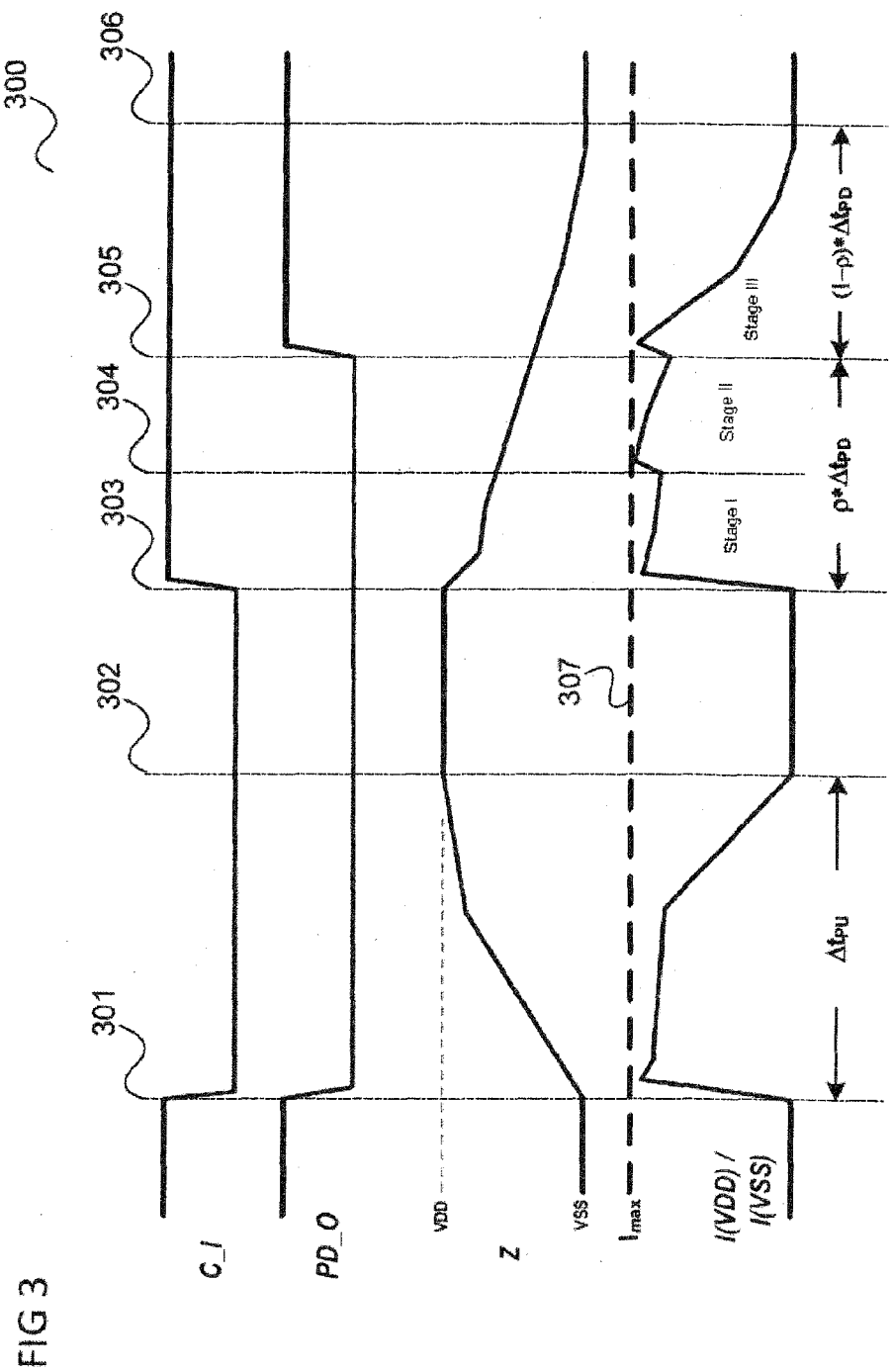
FIG. 3 shows a diagram with signal, potential and current profiles in accordance with one embodiment.

FIG. 3 shows a diagram 300 with signal, potential and current profiles in accordance with one embodiment.

In the diagram 300, time runs from left to right. From top to bottom the illustration shows the profile of the input signal C_I, of the output signal PD_O, of the potential of the output node Z 202 and the magnitude of the entire charging and respectively discharging current of the output node, wherein for each signal, potential and respectively current profile, the respective values increase from the bottom upward.

It is assumed below that the logic value 0 corresponds to the lower supply potential VSS, and that the logic value 1 corresponds to the upper supply potential VDD.

For a temporally constant input signal C_I=0, the output node 202 Z is connected to VDD via the series circuit formed by the turned-on first pMOS transistor 205 and the turned-on second pMOS transistor 206. Specifically, the second node 223 then likewise has the value 0, which arises as follows: the component group consisting of the second nMOS transistor 209, the third nMOS transistor 210, the third pMOS transistor 208, the fourth pMOS transistor 211 and the fifth pMOS transistor 212 and also the component group consisting of the fifth nMOS transistor 217, the sixth nMOS transistor 218, the sixth pMOS transistor 216, the seventh pMOS transistor 219, the eighth pMOS transistor 220 and the ninth pMOS transistor 222 respectively form an inverter having negative feedback (via the output node 202 and a first negative feedback node 226 and respectively a second negative feedback node 227) such that the value of the second node 223 emerges from C_I via four sequential inverting stages and correspondingly the second pMOS transistor 206 is turned on.

Conversely, for temporally constant C_I=1, it holds true that the output node 202 is connected to VSS via the first nMOS transistor 204, the fourth nMOS transistor 213 and the seventh nMOS transistor 221, which are then turned on.

In the example illustrated in FIG. 3, at a first instant 301, a transition from C_I=1 to C_I=0 occurs, which results in a transition from Z=0 to Z=1, which is concluded at a second instant 302. In this case, it should be noted that the second node 223 can assume the value 0 (and thus the second pMOS transistor 206 is switched to the on state) only after the first nMOS transistor 204, the fourth nMOS transistor 213 and the seventh nMOS transistor 221, which are connected by their gate terminals to C_I, the first node 214 and the second node 223, respectively, have been switched off, in other words when all three pull-down stages are inactive. Short-circuit currents from VDD to VSS are avoided as a result. The charging of the output node 202 then takes place via the first pMOS transistor 205 and the second pMOS transistor 206, the dimensioning of which is used to set the charging current and/or the charging time (designated by $\Delta t_{PU}$ in FIG. 3).

A rising edge of C_I, such as occurs at a third instant 303 in this example, is followed by a transition from Z=1 to Z=0, which proceeds in three temporally successive stages.

In a first stage, between the third instant 303 and a fourth instant 304, owing to C_I=1, the first nMOS transistor 204 is turned on, but the fourth nMOS transistor 213 and the seventh nMOS transistor 221 are not turned on, since the first node 214 and the second node 223 still have the value 0 because the output node has not yet been discharged below VDD by at least the absolute value of a pMOS transistor threshold voltage |Vth(pMOS)| and, consequently, the pMOS negative feedbacks consisting of the fifth pMOS transistor 212 and the fourth pMOS transistor 211 and respectively the eighth pMOS transistor 220 and the seventh pMOS transistor 219, said negative feedbacks being connected to the output node 202 at their gate terminals, are not (yet) turned on.

In a second stage between the fourth instant 304 and the fifth instant 305, owing to C_I=1 and the value 1 of the first node 214, both the first nMOS transistor 204 and the fourth nMOS transistor 213 are turned on, but the seventh nMOS transistor 217 is not turned on, since the third node 223 still has the value 0 because, although the output node has been discharged to a level below VDD−|Vth(pMOS)|, the further negative feedback via the second node 223, the ninth pMOS transistor 222 and the second negative feedback node 227 has not yet been overcome, and so the current flowing via the sixth pMOS transistor 216 and the seventh pMOS transistor 219 to the second negative feedback node 227 is largely conducted away to VSS via the ninth pMOS transistor 222 and is not available or is only partly available for charging the second node 223. Illustratively, the ninth pMOS transistor 222 delays the activation of the third pull-down stage and can thus be regarded as an implementation of a delay circuit.

In a third stage between the fifth instant 305 and a sixth instant 306, owing to C_I=1, the value 1 of the first node 214 and the value 1 of the second node 223, both the first nMOS transistor 204, the fourth nMOS transistor 213 and the seventh nMOS transistor 221 are turned on and the output signal PD_O also then (and only then) assumes the value 1, thereby indicating that the third stage has been reached. The latter means that the output node 202, depending on the dimensioning of the negative feedbacks, e.g. the dimensioning of the ninth pMOS transistor 222, then has only a small fraction (e.g. approximately 20%) of the value of VDD.

The output signal PD_O can be used, for example, to drive an (external) counter used for reliably and accurately determining the time interval between the rising edge of C_I and an instant at which Z has certainly reached the level of VSS (designated by $\Delta t_{PD}$ in FIG. 3).

Therefore, while the (maximum) discharging current can be set by means of the dimensionings of the first nMOS transistor 204, of the fourth nMOS transistor 213 and of the seventh nMOS transistor 221, the three-stage procedure ensures that a current that is constant to a good approximation flows at least during a large part of the discharging time, which in turn means a short discharging time under the given boundary conditions (restriction of the discharging current), wherein a maximum charging/discharging current $I_{max}$ 307 is not exceeded.

Figure 4:
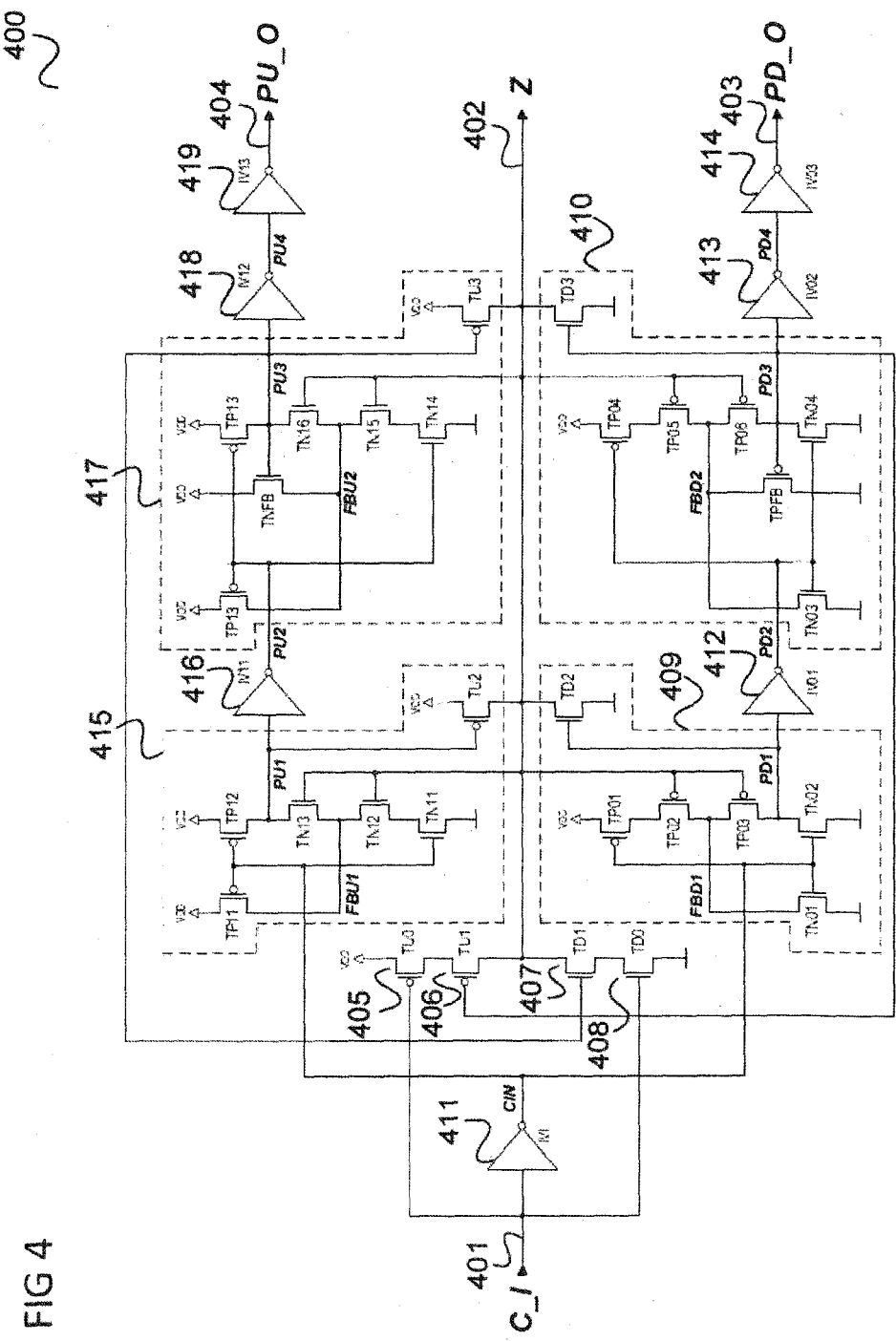
FIG. 4 shows a circuit in accordance with a further embodiment.

A further embodiment, in which not only the discharging of the output node is embodied in three stages (as in the circuit 200), but also the charging of the output node is embodied in three stages, and there is therefore also a further output signal PU_O for indicating the state of the charging process, is illustrated in FIG. 4.

FIG. 4 shows a circuit 400 in accordance with a further embodiment.

The circuit 400 includes, like the circuit 200, an input 401, an output node 402, a first state signal output node 403 corresponding to the state signal output node 203 and a second state signal output node 404. In a manner corresponding to the first inverter 207, the circuit 400 includes a first inverter 411.

The circuit 400 includes a first pMOS transistor 405 and a second pMOS transistor 406 corresponding to the first pMOS transistor 205 and the second pMOS transistor 206. Analogously thereto, the circuit includes a first nMOS transistor 407 and a second nMOS transistor 408, which, illustratively, are arranged (and coupled) in a mirror-inverted manner with respect to the first pMOS transistor 405 and the second pMOS transistor 406 and form a first pull-down stage in a manner corresponding to the first nMOS transistor 204. The first pMOS transistor 405 and the second pMOS transistor 406 analogously form a first pull-up stage.

The circuit 400 furthermore includes a second pull-down stage 409 corresponding to the second pull-down stage of the circuit 200 and a third pull-down stage 410 corresponding to the third pull-down stage of the circuit 200, which are coupled to one another by means of a second inverter 412 (corresponding to the second inverter 215). The third pull-down stage 410, analogously to the third pull-down stage of the circuit 200, is coupled to the first state signal output node 403 by means of a third inverter 413 and a fourth inverter 414 corresponding to the third inverter 224 and the fourth inverter 225.

Analogously to the second pull-down stage 409, the second inverter 412, the third pull-down stage 410, the third inverter 413 and the fourth inverter 414, the circuit 400 includes a second pull-up stage 415, a fifth inverter 416, a third pull-up stage 417, a sixth inverter 418 and a seventh inverter 419, which, illustratively, are arranged and coupled in a mirror-inverted manner with respect to the second pull-down stage 409, the second inverter 412, the third pull-down stage 410, the third inverter 413 and the fourth inverter 414, wherein pMOS transistors replace nMOS transistors, and vice versa, and VDD replaces VSS, and vice versa. The output of the sixth inverter 419 is correspondingly coupled to the second state signal output node 404.

The function of the circuit 400 is analogous to the function of the circuit 200, wherein the charging of the output node 402 is also effected in three stages in the case of the circuit 400.

A pull-down transistor, such as the first nMOS transistor 204, the fourth nMOS transistor 213 and the seventh nMOS transistor 221 (and correspondingly pull-up transistors) can be replaced by a transistor arrangement that makes it possible to select from a plurality of charging (and discharging) currents, such that the (dis)charging current in a respective stage can be set not just by means of the dimensioning of the pull-down/up transistor, but by corresponding driving of the transistor arrangement. This is illustrated in FIG. 5.

Figure 5:
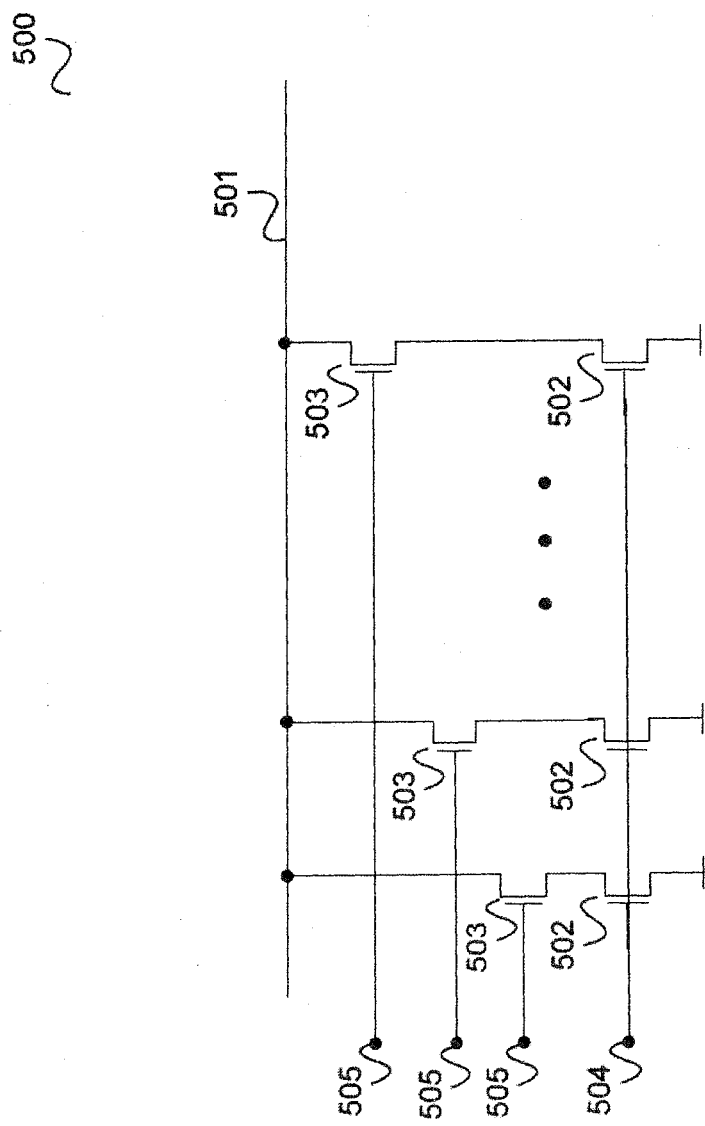
FIG. 5 shows a transistor arrangement in accordance with one embodiment.

FIG. 5 shows a transistor arrangement 500 in accordance with one embodiment.

In this example, the transistor arrangement 500 serves for discharging a node 501. A transistor arrangement for charging a node can be constructed analogously.

The transistor arrangement 500 includes first nMOS transistors 502, the source terminals of which are coupled to VSS. For each nMOS transistor 502, a second nMOS transistor 503 is provided, the source terminal of which is coupled to the drain terminal of the nMOS transistor. The drain terminals of the second nMOS transistors 502 are coupled to the node 501.

The gate terminals of the first nMOS transistors 502 are coupled to an input node 504, via which an activation signal can be fed in, which activates the transistor arrangement for discharging the node 501. By way of example, the input signal is the C_I signal if the transistor arrangement 500 is used instead of the first nMOS transistor 204.

Each first nMOS transistor 502 together with the second nMOS transistor 503 provided for it forms a branch which can be switched on or switched off by means of a corresponding level at a control input node 505 coupled to the gate terminal of the second nMOS transistor 503. In this way, it is possible to choose a specific number of branches which discharge the node 501 upon activation by the activation signal and a desired discharging current can thus be set.

By way of example, in the case of four identical branches it is possible to select from four discharging currents.

By way of example, a decoder circuit can be provided for selecting the active branches.

Although the invention has been shown and described primarily with reference to specific embodiments, it should be understood by those familiar with the technical field that numerous modifications with regard to configuration and details thereof can be implemented, without departing from the essence and scope of the invention as defined by the following claims. Therefore, the scope of the invention is determined by the appended claims, and the intention is for all modifications to be encompassed which come under the literal meaning or fall within the scope of equivalence of the claims.

What is claimed is:

1. A circuit for charging and discharging a node with a limited current, comprising:
an output node of the circuit configured to be charged or discharged as rapidly as possible subject to a predefined maximum current;
a first potential varying stage, which is designed to couple the output node of the circuit to a supply potential in reaction to an input signal, wherein a first current flows, wherein the first current is below the predefined maximum current, dependent on a potential of the output node of the circuit, between the output node of the circuit and the supply potential through the first potential varying stage;
a second potential varying stage, which is designed to couple the output node of the circuit to the supply potential after the difference between the potential of the output node of the circuit and the supply potential drops below a predefined threshold value via the first current, the second potential varying stage comprising a second output node, the second output node configured to provide a second logical control signal, wherein a second current flows, dependent on the potential of the output node of the circuit and the logical control signal, between the output node of the circuit and the supply potential through the second potential varying stage;
a third potential varying stage comprising a third output node, the third output node configured to provide a third logical control signal, the third potential varying stage designed to couple the output node of the circuit to the supply potential via the third logical control signal when the difference between the potential of the output node of the circuit and the supply potential lies below a further predefined threshold value;
wherein when the first potential varying stage and the second potential varying stage are coupled to the output node of the circuit, the sum of the first current and the second current are below the predefined maximum current.

2. The circuit as claimed in claim 1,
wherein the supply potential is a low supply potential and the potential varying stages are pull-down stages, or wherein the supply potential is a high supply potential and the potential varying stages are pull-up stages.

3. The circuit as claimed in claim 1, further comprising:
an input node, wherein the input signal is the presence of a predefined level at the input node.

4. The circuit as claimed in claim 3,
wherein the first potential varying stage is designed to couple the output node of the circuit to the supply potential as long as the predefined level is present at the input node.

5. The circuit as claimed in claim 3,
wherein the second potential varying stage is designed to couple the output node to the supply potential if the difference between the potential of the output node and the supply potential lies below a predefined threshold value and if the predefined level is present at the input node.

6. The circuit as claimed in claim 3, further comprising:
a further potential varying stage which is designed to couple the output node to a further supply potential if a further predefined level, which differs from the predefined level, is present at the input node.

7. The circuit as claimed in claim 1,
wherein the further threshold value and the threshold value are different.

8. The circuit as claimed in claim 1,
wherein the threshold value lies between the supply potential and a further supply potential.

9. The circuit as claimed in claim 1, further comprising:
a state signal output and a state signal generating circuit, which is designed to generate a state signal and to output it by means of the state signal output, said signal indicating whether the difference between the potential of the output node and the supply potential lies below a predefined threshold value, or indicating whether the difference between the potential of the output node and the supply potential lies below a further predefined threshold value.

10. The circuit as claimed in claim 1,
wherein the second potential varying stage has a detection circuit, which detects whether the difference between the potential of the output node and the supply potential lies below the predefined threshold value.

11. The circuit as claimed in claim 1,
wherein the second potential varying stage has a switch having a control input, wherein the control input is coupled to the output node and the switch is designed to be switched on depending on whether the difference between the potential of the output node and the supply potential lies below the predefined threshold value.

12. The circuit as claimed in claim 11,
wherein the switch is a field effect transistor, the gate terminal of which is coupled to the output node.

13. The circuit as claimed in claim 1,
wherein the second potential varying stage has a delay circuit, which delays the coupling of the output node to the supply potential by the second potential varying stage relative to the coupling of the output node to the supply potential by the first potential varying stage.

14. The circuit as claimed in claim 1,
wherein the third potential varying stage couples the output node to the supply potential after the difference between the potential of the output node and the supply potential drops below a further predefined threshold value via the first current and the second current; wherein a third current flows, dependent on the potential of the output node, between the output node and the supply potential through the third potential varying stage; and wherein when the first potential varying stage, the second potential varying stage, and the third potential varying stage, are coupled to the output node, the sum of the first current, the second current, and the third current, are below the predefined maximum current.

15. The circuit as claimed in claim 1,
wherein the output node of the circuit is coupled to a high capacitive load.

16. A circuit for charging and discharging a node with a limited current, comprising:
an output node configured to be charged or discharged as rapidly as possible subject to a predefined maximum current;
a first potential varying stage, which is designed to couple the output node to a supply potential in reaction to an input signal, wherein a first current flows, wherein the first current is below the predefined maximum current, dependent on a potential of the output node, between the output node and the supply potential through the first potential varying stage;

a second potential varying stage, which is designed to couple the output node to the supply potential after the difference between the potential of the output node and the supply potential drops below a predefined threshold value via the first current, wherein a second current flows, dependent on the potential of the output node, between the output node and the supply potential through the second potential varying stage;

wherein when the first potential varying stage and the second potential varying stage are coupled to the output node, the sum of the first current and the second current are below the predefined maximum current;

wherein the second potential varying stage has a detection circuit, which detects whether the difference between the potential of the output node and the supply potential lies below the predefined threshold value; and a state signal output and a state signal generating circuit, which is designed to generate a state signal and to output it by means of the state signal output, said signal indicating whether the difference between the potential of the output node and the supply potential lies below a predefined threshold value, or indicating whether the difference between the potential of the output node and the supply potential lies below a further predefined threshold value.

* * * * *